United States Patent [19]

Murata et al.

[11] Patent Number: 5,107,388
[45] Date of Patent: Apr. 21, 1992

[54] HALL-EFFECT MAGNETIC SENSOR ARRANGEMENT

[75] Inventors: Shigemi Murata; Yutaka Ohashi, both of Himeji, Japan

[73] Assignee: Mitsubishi Denki K.K., Tokyo, Japan

[21] Appl. No.: 649,255

[22] Filed: Jan. 31, 1991

Related U.S. Application Data

[63] Continuation of Ser. No. 393,160, Aug. 14, 1989, abandoned.

[30] Foreign Application Priority Data

Aug. 12, 1988 [JP] Japan ............... 63-105893[U]

[51] Int. Cl.$^5$ .............................................. H02H 9/04
[52] U.S. Cl. ...................................... 361/56; 361/111
[58] Field of Search ............ 361/88, 56, 111, 58, 361/179; 307/116

[56] References Cited

U.S. PATENT DOCUMENTS 4,359,978 11/1982 Brammer et al. .
4,441,136 4/1984 Hampshire ........................... 361/88

Primary Examiner—Todd E. DeBoer
Attorney, Agent, or Firm—Sughrue, Mion, Zinn, Macpeak & Seas

[57] ABSTRACT

A Hall-effect magnetic sensor arrangement comprising Hall-effect IC, an anti-surge electric source protective circuit electrically connected to the Hall-effect IC, and a substrate for mounting thereon the Hall-effect IC and the protective circuit. The Hall-effect IC as well as the protective circuit mounted on the substrate are in the form of a hybrid IC.

2 Claims, 1 Drawing Sheet

HALL-EFFECT MAGNETIC SENSOR ARRANGEMENT

This is a continuation of application Ser. No. 07/393,160 filed Aug. 14, 1989, now abondoned.

BACKGROUND OF THE INVENTION

This invention relates to Hall-effect magnetic sensor arrangement and more particularly to a Hall-effect magnetic sensor particularly suitable for use in a rotational position detector for an internal combustion engine.

FIG. 1 is a schematic sectional side view of the main portion of a conventional Hall-effect magnetic sensor arrangement used in a rotational angular position detector for an internal combustion engine. It is seen that the Hall-effect magnetic sensor comprises a Hall-effect IC 1 connected to an electric source protective circuit 2 through a power line 3. The Hall-effect IC 1 is a hybrid integrated circuit including a Hall-effect element (not shown) and an auxiliary circuit (not shown) for operating the Hall-effect element as a magnetic sensor. The protective circuit 2 is for the protection against surges and includes a plurality of discrete electronic components 4 and 5 mounted on a printed circuit board 6 by soldering 7. Although not illustrated, the Hall-effect magnetic sensor of the above construction is used as a rotation detecting sensor of a rotational position detector installed within a distributor housing for an internal combustion engine.

According to the conventional magnetic sensor of the above construction, the Hall-effect IC 1 and the protective circuit 2 (made up of separate components 4 and 5) are electrically connected by the power line 3. Therefore, a relatively large space for accommodating the power source protective circuit 2, which is relatively large because of the plurality of discrete electronic components 4 and 5 mounted on the printed circuit board 6, is necessary. Also, the electronic components 4 and 5 are soldered at 7 to the printed circuit board 6, so that the reliability of the electrical connection by the soldering 7 is not very high.

SUMMARY OF THE INVENTION

Accordingly, one object of the present invention is to provide a Hall-effect magnetic sensor arrangement free from the above-discussed problem of the conventional magnetic sensor arrangement.

Another object of the present invention is to provide a Hall-effect magnetic sensor arrangement compact in size.

Another object of the present invention is to provide a Hall-effect magnetic sensor arrangement that is reliable.

A further object of the present invention is to provide a Hall-effect magnetic sensor arrangement less expensive than that of the conventional magnetic sensor arrangement.

With the above objects in view, the Hall-effect magnetic sensor arrangement of the present invention comprises a Hall-effect IC, an anti-surge electric source protective circuit electrically connected to the Hall-effect IC, and a substrate for mounting thereon the Hall-effect IC and the protective circuit. The Hall-effect IC and the protective circuit is mounted on the substrate in the form of a hybrid IC.

BRIEF DESCRIPTION OF THE DRAWINGS

The present invention will become more readily apparent from the following detailed description of the preferred embodiment of the present invention taken in conjunction with the accompanying drawings, in which.

DESCRIPTION OF THE PREFERRED EMBODIMENT

Figure 1:
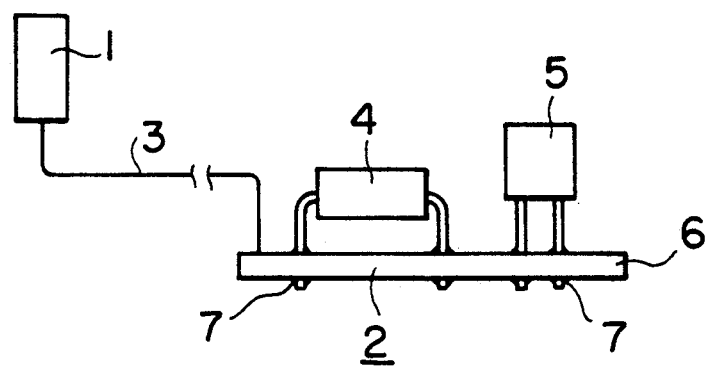
FIG. 1 is a schematic side view of the main portion of a conventional Hall-effect magnetic sensor arrangement particularly useful in a rotational angular position detector for an internal combustion engine.
Figure 2:
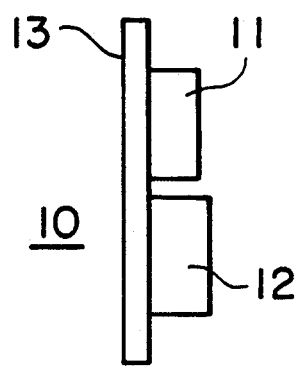
FIG. 2 is a schematic side view of the main portion of the Hall-effect magnetic sensor arrangement of the present invention particularly useful in a rotational angular position detector in an internal combustion engine.

In FIG. 2, it is seen that the Hall-effect magnetic sensor arrangement 10 of the present invention comprises a Hall-effect IC 11, an anti-surge power source protective circuit 12 electrically connected to the HAll-effect IC 11, and a ceramic substrate 13 for mounting thereon the Hall-effect IC 11 and the protective circuit 12. As in the conventional design, the Hall-effect IC 11 is a hybrid integrated circuit including a Hall-effect element (not showm) and an auxiliary circuit (not shown) for operating the Hall-effect element as a magnetic sensor. According to the present invention, the protective circuit 12 is for the protection against surges and is mounted on the ceramic substrate 13 in the form of a hybrid IC in which various electronic components constituting a power source protective circuit is hybrid-integrated. The Hall-effect IC 11 as well as the power source protective circuit 12 may be any suitable conventional circuit, and suitable conventional hybrid IC techniques may be used without any particular limitation. Although not illustrated, the Hall-effect magnetic sensor of the above construction is used as a rotation detecting sensor of a rotational position detector installed within a distributor housing for an internal combustion engine.

With the above construction, the electric power to the Hall-effect IC 11 is supplied through the power source protective circuit 12 which is a hybrid IC. In this embodiment, the Hall-effect IC 11 and the protective circuit 12 are mounted on the single common ceramic substrate 13, so that there is no need for the power line being extended around as in the conventional sensor arrangement and that the arrangement can be made compact. Also, since the power source protective circuit 12 is a hybrid IC in this embodiment, soldering is not necessary, resulting in a highly reliable arrangement. Further, when mass-produced, the manufacturing cost can be decreased.

Further, the Hall-effect magnetic sensor arrangement of the present invention is not limited to be used in an internal combustion engine rotational position detector, but it can be advantageously used in position and angle detection in various fields.

As has been described, the Hall-effect magnetic sensor arrangement of the present invention comprises a Hall-effect IC, an anti-surge electric source protective circuit electrically connected to the Hall-effect IC, and a substrate for mounting thereon the Hall-effect IC and the protective circuit, and the protective circuit is mounted on the substrate in the form of a hybrid IC.

Therefore, the Hall-effect magnetic sensor arrangement of the present invention is compact, reliable and is less expensive.

What is claimed is:

1. A Hall-effect magnetic sensor arrangement comprising:

a Hall-effect IC;

an anti-surge electric source protective circuit electrically connected to said Hall-effect IC for supplying power to said Hall-effect IC, and protecting said Hall-effect IC from surges generated external to said Hall-effect IC; and a ceramic substrate for commonly mounting thereon said Hall-effect IC and said protective circuit in the form of a hybrid IC;

said protective circuit mounted on said substrate being in a form of a hybrid IC, said protective circuit having electronic components which are hybrid-integrated.

2. A Hall-effect magnetic sensor arrangement as claimed in claim 1, wherein said substrate comprises a ceramic substrate.

* * * * *